(12) United States Patent
Verma et al.

(10) Patent No.: US 11,594,276 B2
(45) Date of Patent: Feb. 28, 2023

(54) SELF-ADJUSTABLE SELF-TIMED DUAL-RAIL SRAM

(71) Applicant: Synopsys, Inc., Mountain View, CA (US)

(72) Inventors: Praveen Kumar Verma, Noida (IN); Sanjay Kumar Yadav, Noida (IN); Rohan Makwana, Noida (IN); Vijit Gadi, Noida (IN)

(73) Assignee: Synopsys, Inc., Mountain View, CA (US)

( * ) Notice: Subject to any disclaimer, the term of this patent is extended or adjusted under 35 U.S.C. 154(b) by 77 days.

(21) Appl. No.: 16/878,498

(22) Filed: May 19, 2020

(65) Prior Publication Data
US 2021/0005248 A1 Jan. 7, 2021

(51) Int. Cl.
*G11C 11/417* (2006.01)
*G11C 11/419* (2006.01)

(52) U.S. Cl.
CPC .......... *G11C 11/417* (2013.01); *G11C 11/419* (2013.01)

(58) Field of Classification Search
CPC .................................................. G11C 11/417
USPC ........................................................ 365/154
See application file for complete search history.

(56) References Cited

U.S. PATENT DOCUMENTS

| | | | | |
|---|---|---|---|---|
| 8,279,659 B2* | 10/2012 | Cho | ........................ | G11C 7/227 365/194 |
| 8,724,421 B2 | 5/2014 | Evans et al. | | |
| 9,001,572 B2 | 4/2015 | Choi et al. | | |
| 9,064,559 B2 | 6/2015 | Maiti et al. | | |
| 2007/0086248 A1* | 4/2007 | Daga | ...................... | G11C 16/30 365/185.23 |
| 2010/0039872 A1* | 2/2010 | Park | .......................... | G11C 8/08 365/189.11 |
| 2011/0194362 A1* | 8/2011 | Lu | ............................ | G11C 8/10 365/189.11 |
| 2015/0340073 A1* | 11/2015 | Seo | .......................... | G11C 7/22 365/189.09 |
| 2019/0392889 A1* | 12/2019 | Trivedi | ................. | G06F 1/3275 |

* cited by examiner

*Primary Examiner* — Sung Il Cho
(74) *Attorney, Agent, or Firm* — Weaver Austin Villeneuve & Sampson LLP (57) ABSTRACT

A dual-rail memory includes, in part, a memory array that operates using a first supply voltage, and a periphery circuit that operates using a second supply voltage. The periphery circuit includes, in part, a clock generation circuit and a comparator. The dual-rail memory also includes a level shifter that varies the voltage level of a number of signals of the memory between the first and second supply voltages. The clock generation circuit is adapted, among other operations, to generate a read clock signal in response to a read request signal. The level shifter is adapted to supply a reference wordline read signal in response to the read clock signal. The comparator is adapted to select a delay between the read clock signal and the reference wordline read signal in response to a difference between the first and second supply voltages.

30 Claims, 8 Drawing Sheets

SELF-ADJUSTABLE SELF-TIMED DUAL-RAIL SRAM

CROSS REFERENCE TO RELATED APPLICATIONS

The present application claims benefit of Indian Application No. 201911019699, filed May 19, 2019, entitled "Self-adaptive Scheme for dual Rail to Improve Performance and Power of SRAM", the content of which is incorporated herein by reference in its entirety.

TECHNICAL FIELD

The present disclosure relates to static random access memories (SRAM), and more particularly to adjusting delays in dual-rail SRAMs.

BACKGROUND

The increase in design complexity and number of devices integrated in a System-on-a-Chip (SOC) often leads to a significant increase in the power consumption of the SOC. Static Random Access Memories, which are often an important component of an SOC, consume a relatively large percentage of the power. Low power SRAMs have gained popularity due to their widespread adoption in hand-held devices. A known technique for reducing the dynamic power consumption of an SRAM is to lower the operating voltage. However, lowering the operating voltage degrades the performance and results in SRAM cell instability and poor writabiliy. To overcome such shortcomings, dual-rail SRAMs have been developed.

A conventional dual-rail SRAM uses two different supply voltages. One of the supply voltages powers the memory or cell array and is referred to as $V_{DDA}$. The second supply voltage powers the periphery logic and is referred to as $V_{DDP}$. The dual-rail (also referred to as dual-supply) technique enables independent modulation of $V_{DDA}$ and $V_{DDP}$ voltage levels based on the performance and power requirements. For example, to achieve a lower power consumption, the $V_{DDP}$ level may be reduced while keeping the $V_{DDA}$ level fixed. However, having two different supply voltages necessitates the use of two voltage regulators, one to regulate $V_{DDA}$ and another to regulate $V_{DDP}$.

Mismatches and nonideality between the two voltage regulators may generate unexpected voltage levels. Further mismatches in the voltage supplies may also occur due to the ohmic drop within the memory. Therefore, even under conditions when $V_{DDA}$ is expected to be equal to $V_{DDP}$, mismatches and non-deal behaviors in the voltage regulators may cause $V_{DDP}$ to be higher than $V_{DDA}$ thus causing performance degradations, such as narrowing of the read and write windows. To counter such effects, an extra margin on read and write windows may be used. Such an extra margin, however, affects the access time and cycle time of the memory and also increases the dynamic power consumption of the SRAM. Therefore, a need continues to exist for a dual-supply SRAM that avoids the above-described shortcomings.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a self-adjustable self-timed dual-rail SRAM. The SRAM is adapted to adjust the delay during read and write operations in response to the difference between the dual supply voltages. The SRAM thus has a reduced dynamic power consumption and an enhanced performance.

Figure 1:
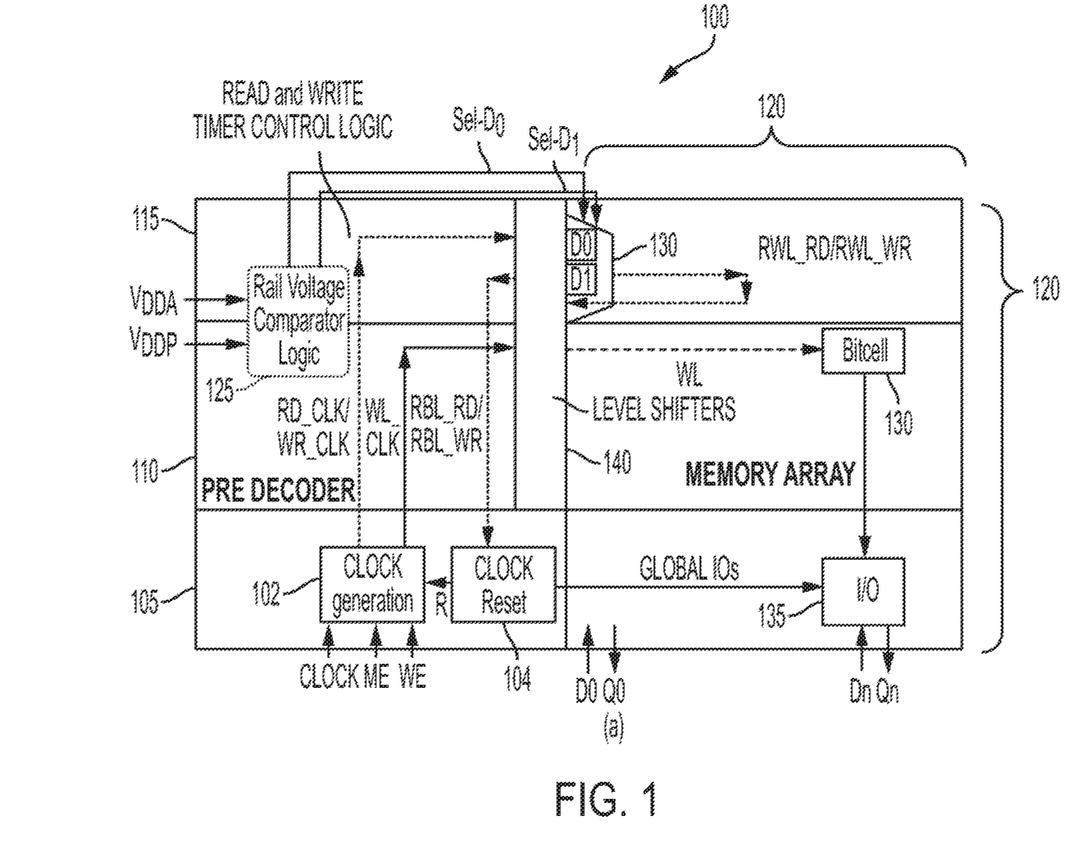
FIG. 1 is a simplified high-level block diagram of a dual-rail SRAM, in accordance with one embodiment of the present invention.

FIG. 1 is a simplified high-level block diagram of a dual-rail SRAM 100, in accordance with one embodiment of the present invention. SRAM 100 is shown as including, in part, a memory array 120, a clock control block 105, a pre-decoder 110, a rail-voltage (i.e., supply voltage) comparator logic 125, a read/write timer control logic block 115, a multiplexer 130, and a level shifter 140. It is understood that SRAM 100 includes many other blocks, such as decoders, sense amplifiers and buffers that are not shown in FIG. 1 to maintain simplicity and clarity.

Although not shown, it is understood that memory array 120 includes a two-dimensional array of memory cells 130 arranged along a multitude of rows and columns. The number of memory cells (bitcells) forming the memory-width may vary. For example, in a 16-bit wide memory, any given address selects the wordline (WL) associated with the 16 bitcells disposed in that address. The selection of the WL causes the associated bitcells to be coupled to a multitude of sense amplifiers adapted to read the data stored in the bitcells and supply the data so read to the I/O buffers. In FIG. 1, bitcell 130 is shown as being coupled to I/O buffer 135 which delivers the data read from the memory.

Memory array 120 of SRAM 100 receives and operates with supply voltage $V_{DDA}$. The remaining blocks of SRAM 100, other than level shifter 140, receive and operate with supply voltage $V_{DDP}$. Level shifter 140 is adapted to shift the voltage level from $V_{DDA}$ to $V_{DDP}$, or from $V_{DDP}$ to $V_{DDA}$, as described further below. Clock control block 105 is shown as including, in part, a clock generation circuit 102 and a clock reset circuit 104.

Signal ME, received by clock generation circuit 102, is used to enable or disable SRAM 100. Signal WE, received by clock generation circuit 102, is used to enable write operation to the array. Signal CLOCK, also received by clock generation circuit 102, is used to generate the read clock signal RD_CLK and the write clock signal WR_CLK used to perform memory read and write operations, respectively. Clock generation circuit 102 also generates the wordline clock signal WL_CLK that is subsequently level shifted by level shifter 140 and applied to the wordline (shown as WL in FIG. 1) of the addressed memory cells for the read or write operation.

When signal CLOCK is asserted (i.e., a rising or a falling transition occurs in signal CLOCK) to perform a read (or write operation), the internal self-timed read clock RD_CLK (or write clock WR_CLK) is triggered. For a read operation, the triggering of signal RD_CLK causes multiplexer 130 to assert the reference wordline read signal RWL_RD. For a write operation, the triggering of signal WR_CLK causes multiplexer 130 to assert the reference wordline write signal RWL_WL. As is described further below, in accordance with embodiments of the present invention, for a read operation, the time period between the assertion of signal RD_CLK and the subsequent assertion of signal RWL_RD is self-timed. Likewise, for a write operation, the time period between the assertion of signal WR_CLK and the subsequent assertion of signal RWL_RD is self-timed.

For a read operation, the assertion of signal RWL_RD causes the reference bitline read signal RBL_RD to be asserted, which in turn causes the read clock signal RD_CLK to be deasserted. The deassertion of signal RD_CLK causes signal RWL_RD to be deasserted, which in turn, causes signal RBL_RD to be deasserted. Similarly, for a write operation, the assertion of signal RWL_WR causes the reference bitline write signal RBL_WR to be asserted, which in turn causes the write clock signal WR_CLK to be deasserted. The deassertion of signal WR_CLK causes signal RWL_WR to be deasserted, which in turn, causes signal RBL_WR to be deasserted.

As shown in FIG. 1 and described in detail below, the read clock signal RD_CLK, activated during a read operations, is level shifted by level shifter 140 and delayed the self-timed input by either a delay element D0 or a default delay, before triggering the reference wordline signal RWL_RD. Similarly, the write clock signal WR_CLK, activated during a write operations, is level shifted by level shifter 140 and delayed the self-timed input by either a delay element D0 or a default delay, before triggering the reference wordline signal RWL_WR. Signals RWL_RD and RWL_WR are adapted to travel half the length of the wordlines in the array before returning and being applied to the reference memory cells (not shown). Signals RWL_RD and RWL_WR trigger the reference bitline read signal RBL_RD and the reference bitline write signal RBL_WR respectively.

Signals RBL_RD and RBL_WR are applied to clock reset circuit 104 which, in response, generates the reset signal R. In response to receiving signal R, clock generation circuit 102 resets the read clock RD_CLK during read operations, and resets the write clock WR_CLK during write operations.

Figure 2:
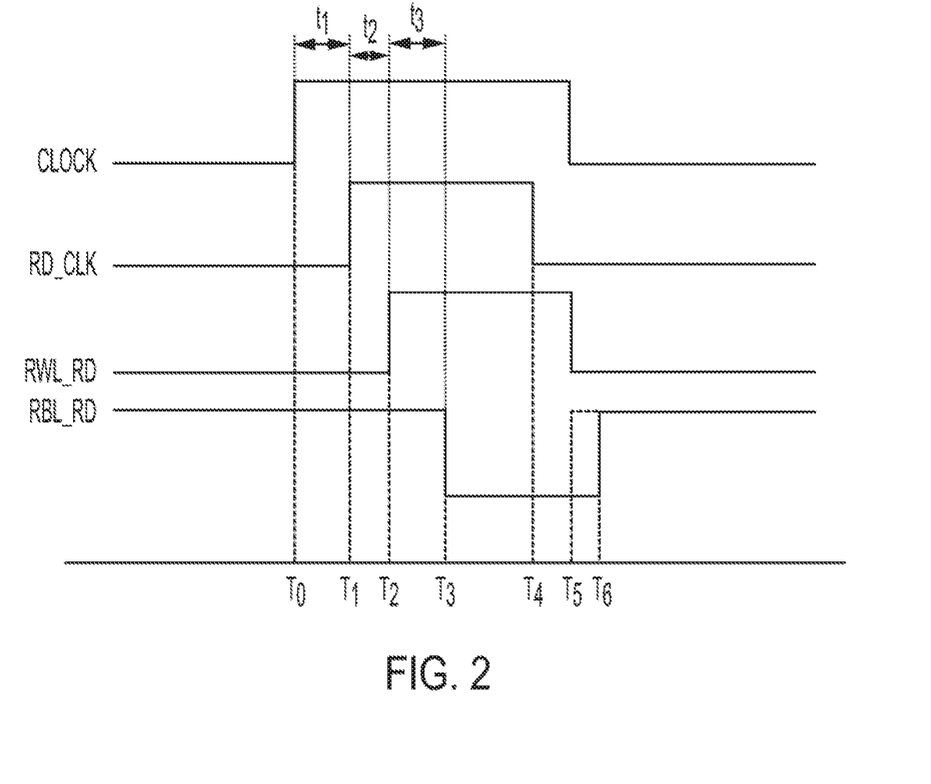
FIG. 2 is a timing diagrams of a number of signals associated with the SRAM of FIG. 1 during a read operation, in accordance with one embodiment of the present invention.

FIG. 2 is a timing diagram of a number of signals associated with SRAM 100 of FIG. 1 during a read operation. Signal CLOCK is shown as making a low-to-high transition at time $T_0$. In response, the read clock signal RD_CLK makes a low-to-high transition at time $T_1$. The transition of signal RD_CLK, in turn, causes the reference wordline read signal RWL_RD to transition from low to high at time $T_2$. In response to the transition of signal RWL_RD, the reference bitline read signal RBL_RD make a high-to-low transition at time $T_3$. The high-to-low transition of signal RBL_RD at time $T_3$ causes the read clock signal RD_CLK to be reset at time $T_4$, in turn, causing the reference wordline read signal RWL_RD and the reference bitline read signal RBL_RD to be reset at times $T_5$ and $T_6$ respectively. The period between the assertion of signals RD_CLK and RWL_RD, i.e. $(T_2-T_1)$, is the time interval between the start of the internal self-timed clock and the assertion of the reference wordline, as described further below. As was described above, signals CLOCK, and RD_CLK are adapted to vary between the ground potential and $V_{DDP}$, whereas signal RWL_RD and RBL_RD are adapted to vary between the ground potential and $V_{DDA}$.

Figure 3:
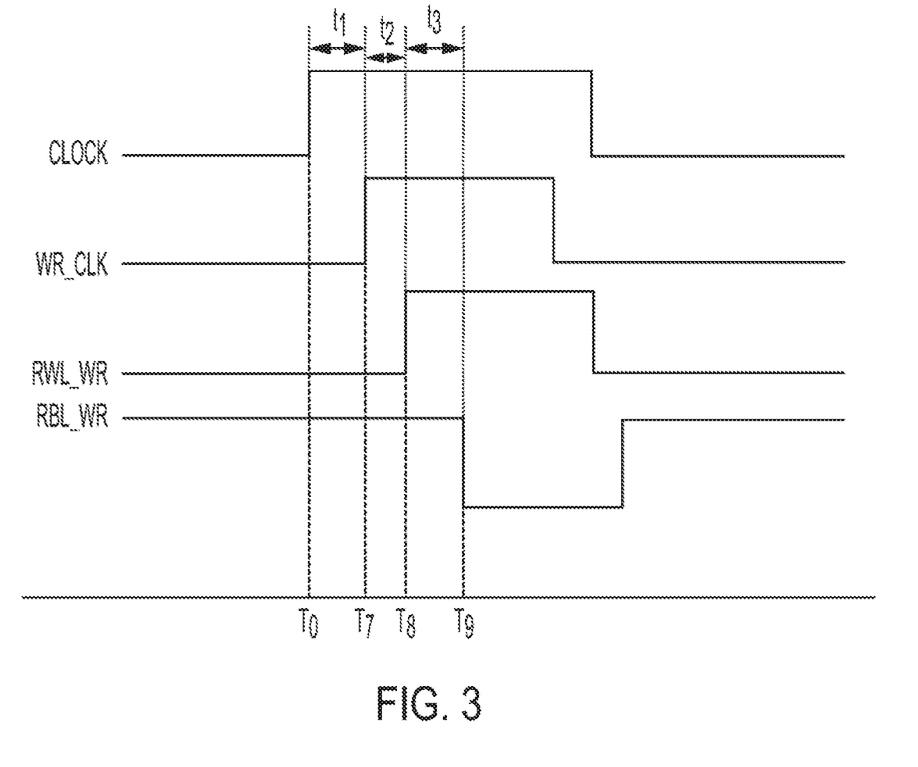
FIG. 3 is a timing diagrams of a number of signals associated with the SRAM of FIG. 1 during a write operation, in accordance with one embodiment of the present invention.

FIG. 3 is a timing diagram of a number of signals associated with SRAM 100 of FIG. 1 during a write operation. The assertion and deassertion of the signals in FIG. 3 occur in a manner similar to those shown in FIG. 2 except that the signals shown in FIG. 3 are applicable to a write operation. The period between the assertion of signals WR_CLK and RWL_WR, i.e. $(T_8-T_7)$ is also self-timed, as described further below. Signals CLOCK, and WR_CLK and are adapted to vary between the ground potential and $V_{DDP}$, whereas signal RWL_WR and RBL_WR are adapted to vary between the ground potential and $V_{DDA}$.

Voltage comparator 125 is adapted to compare voltages $V_{DDA}$ and $V_{DDP}$ and, in response, generate comparison signals Sel_D0 and Sel_D1. If $V_{DDA}$ is detected as being greater than or equal to $V_{DDP}$ then signal Sel_D1 is set to "0" thereby causing delay element D1 to be selected. Conversely, if $V_{DDA}$ is detected as being smaller than $V_{DDP}$ then signal Sel_D0 is set to "0" thereby causing delay element D0 to be selected.

Figure 4:
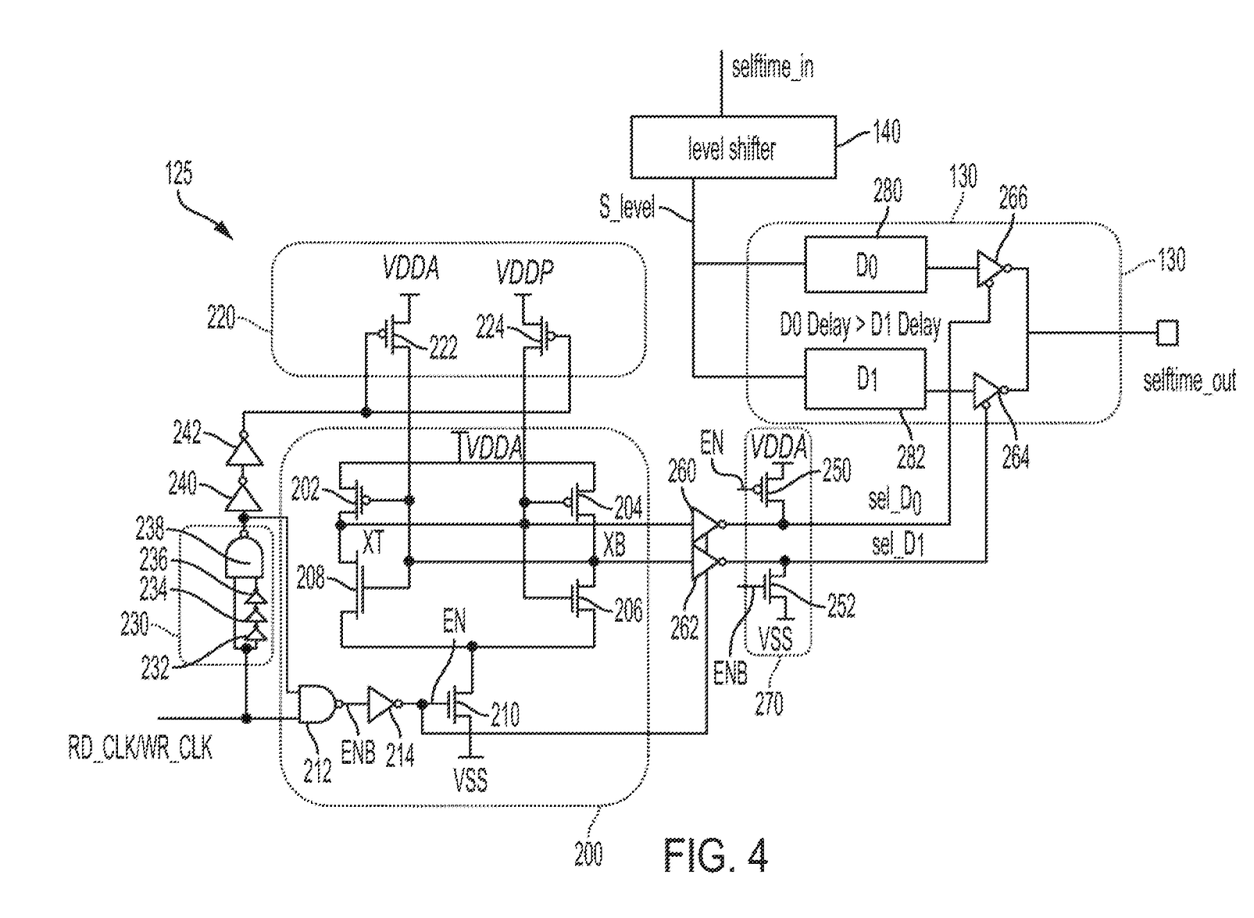
FIG. 4 is a schematic diagram of the comparator disposed in the SRAM of FIG. 1, in accordance with one embodiment of the present invention.

FIG. 4 is a transistor/gate-level schematic diagram of comparator 125 of SRAM 100 driving multiplexer 130, in accordance with one exemplary embodiment of the present invention. Comparator 125 is shown as including, in part, an unbalanced sense amplifier 200, a rail different generator 220, a pulse shaper 230, state keeper circuit 270, inverters 240, 242, and controlled inverters 260, 262.

Unbalanced sense amplifier 200 is shown as including, in part, PMOS transistors 202, 204, NMOS transistor 206, 208, 210, inverter 214 and NAND gate 212. Because transistor 208 is selected to be stronger than transistor 206 (i.e., the ratio of the channel-width (W) to channel length (L) of transistor 208 is greater than the W/L of transistor 206), unbalanced sense amplifier 200 is biased towards supply voltage $V_{DDA}$. Accordingly, unbalanced sense amplifier 200 causes the selection of the D1 delay element unless $V_{DDP}$ is greater than $V_{DDA}$ by a predefined value, such as 30 mV.

Rail difference generator 220 includes PMOS transistors 222 and 224 that respectively receive supply voltages $V_{DDA}$ and $V_{DDP}$ at their source terminals. The gates of PMOS transistors 222 and 224 are driven by pulse shaper 230 via inverters 240, 242. The drain terminal of PMOS transistor 222 is coupled to the gate terminal of transistors 202, 208 and to node XB which is the common drain terminal of transistors 204, 206. The drain terminal of PMOS transistor 224 is coupled to the gate terminal of transistors 204, 206 and to node XT which is the common drain terminal of transistors 202, 208.

Prior to a read or write cycle, when both RD_CLK and WR_CLK are at logic "0", both PMOS transistors 222 and 224 are off and signals EN and ENB are at logic "0" and logic "1" respectively. Therefore, signal Sel_D0 is pulled to the supply voltage $V_{DDA}$ by PMOS transistor 250 and signal Sel_D1 is pulled to the ground ($V_{SS}$) voltage by NMOS transistor 252. The high voltage level of signal Sel_D0 disables controlled inverter 266, and the low voltage level of signal Sel_D1 enables controlled inverter 264. Accordingly, prior to a read or write cycle, the D1 delay is selected by multiplexer 130.

Pulse shaper 230 is adapted to generate a high-to-low pulse at the start of a read cycle when signal RD_CLK is asserted, or at the start of a write cycle when signal WR_CLK is asserted. The high-to-low pulse causes PMOS transistors 222 and 224 to turn on, thereby causing nodes XT and XB to charge to supply voltages $V_{DDA}$ and $V_{DDP}$ respectively. The assertion of the signal RD_CLK or WR_CLK also causes signal EN to be at a logic "1" level after the generation of the voltage offset between nodes XB and XT of unbalance sense amplifier 200.

If $V_{DDA}$ is greater than or equal to $V_{DDP}$, then voltage at node XB is greater than the voltage at XT. The higher voltage at node XB together with the fact transistor 208 is stronger and more conductive than transistor 206 causes node XT to discharge to ground and node XB to remain at $V_{DDA}$. Because EN is at a high voltage level and ENB is at a low logic level, transistors 250 and 252 are off. The ground voltage at node XT causes controlled inverter 260 to set signal Sel_D0 to a high logic level thereby disabling controlled inverter 266. The $V_{DDA}$ voltage at node XB causes controlled inverter 262 to set signal Sel_D1 to a low logic level thus enabling controlled inverter 264. Accordingly, when $V_{DDA}$ is greater than or equal to $V_{DDP}$, signal Sel_D1 causes the section of the D1 delay element.

If $V_{DDA}$ is smaller than $V_{DDP}$, the higher voltage at node XT causes node XB to discharge to the ground potential through NMOS transistors 206 and 210. This causes controlled inverter 262 to set signal Sel_D1 to a high level thus disabling controlled inverter 264. The higher voltage at node XT causes controlled inverter 260 to set signal Sel_D0 to a low level thus enabling controlled inverter 266. Accordingly, if $V_{DDA}$ is smaller than $V_{DDP}$, the longer delay element D0 is selected. Signal Selftime_in is applied to level shifter 140 and delayed by either D0 delay or D1 delay, depending on the difference between supply voltages $V_{DDA}$ and $V_{DDP}$ as described above, to generate signal Selftime_out. It is understood that signal Selftime_in corresponds to and represents signal RD_CLK during a read operation, and signal RD_CLK during a write operation. Similarly, signal Selftime_out corresponds to and represents signal RWL_RD during a read operation, or signal RWL_WR during a write operation.

Figure 5:
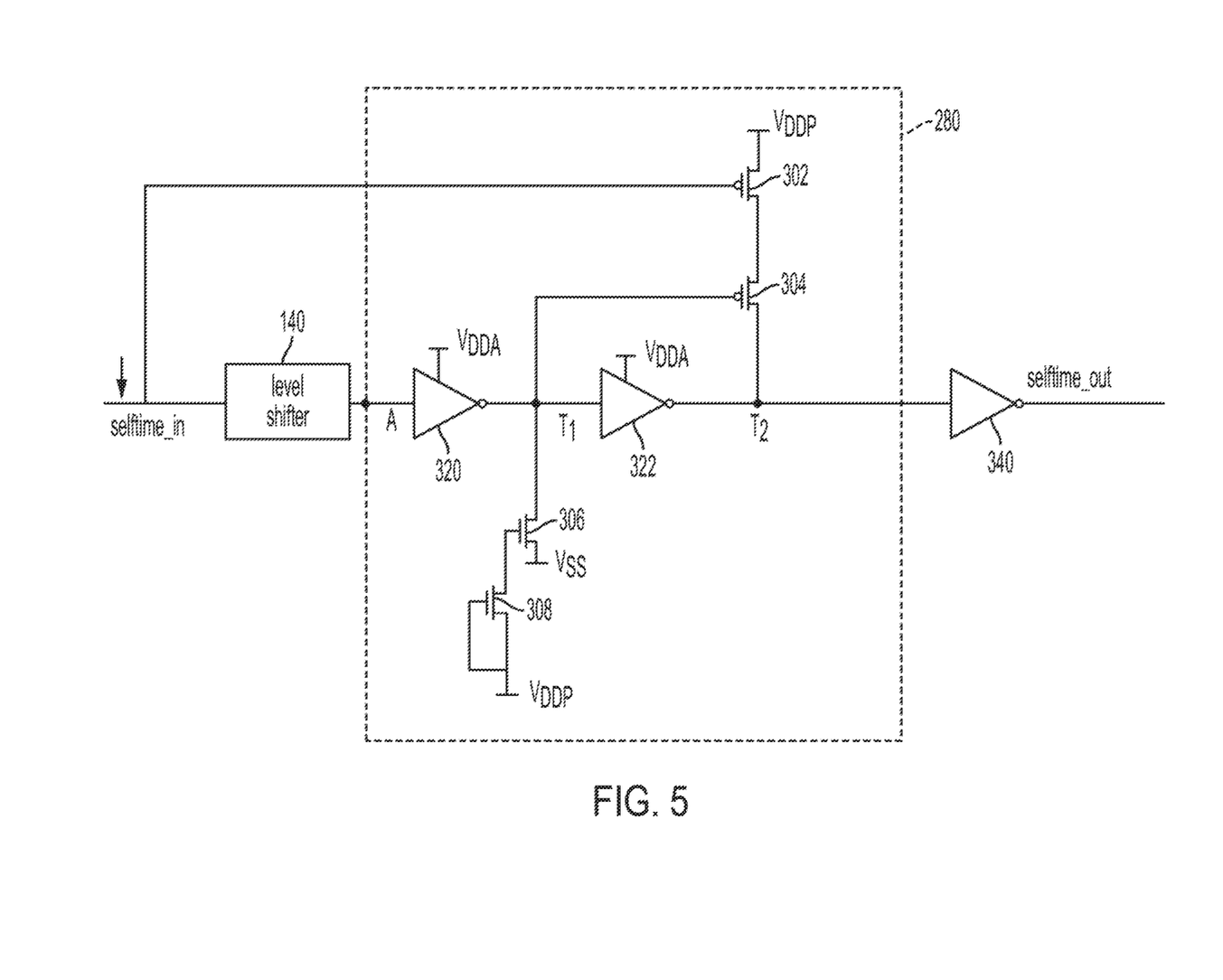
FIG. 5 is a schematic diagram of a self-timed delay element used in the SRAM of FIG. 1, in accordance with one embodiment of the present invention.

Delay element D0 provides a delay that is proportional to the difference between voltages $V_{DDP}$ and $V_{DDA}$. FIG. 5 is a schematic diagram of D0 delay element 280, in accordance with one exemplary embodiment of the present invention. When signal Selftime_in is at logic high, level shifter 140 generates voltage $V_{DDA}$ at node A thus causing node $T_1$ to be pulled to the $V_{SS}$ potential by the pull-down NOMS transistor disposed in inverter 320. Because NMOS transistor 308 is diode-connected, the gate of NMOS transistor 306 is at ($V_{DDP}-V_{TN}$) where $V_{TN}$ represents the threshold voltage of the NMOS transistors. Accordingly, transistor 306 is on and also attempts to pull down node $T_1$ to $V_{SS}$. The low voltage at node $T_1$ causes node $T_2$ to be at $V_{DDA}$ by the pull-up PMOS transistor disposed in inverter 232, in turn causing signal Selftime_out to be at logic low.

When signal Selftime_in goes low (i.e., low logic level), PMOS transistor 302 is on, and because node A is also low, the pull-up PMOS transistor disposed in inverter 320 attempts to pull up node $T_1$ to supply voltage $V_{DDA}$. Transistor 306, however, attempts to pull down node $T_1$ to $V_{SS}$. Because $V_{DDP}$ is greater than $V_{DDA}$ by a predefined value when delay element D0 is selected, and the gate of transistor 306 is at ($V_{DDP}-V_{TN}$), whereas the gate of the PMOS transistor of inverter 320 is at $V_{DDA}$, the voltage at node $T_1$ starts to increase. Because the rate of increase in the voltage at node $T_1$ is dependent on the threshold voltage of NMOS transistor 308, in fast process corners and high temperatures, the voltage at node $T_1$ increases slowly thus causing the delay across delay element 280 to increase. Conversely, in slow process corners and low temperatures, the voltage at node $T_1$ increases relatively quickly thus causing the delay across delay element 280 to decrease.

Node $T_2$ that was precharged to $V_{DDP}$ through PMOS transistors 302 and 304, starts to discharge as the voltage at node $T_1$ starts to the increase, thereby causing PMOS transistor 304 to turn off. At the same time, the increasing voltage at node $T_1$ turns on the NMOS transistor disposed in inverter 322 thus causing node $T_2$ to begin to discharge to the ground potential. The overlap between the time when PMOS transistor 304 is on, and the time when NMOS transistor disposed in inverter 322 is on, creates contention and causes the drop in voltage at node $T_2$ to be proportional to and defined by the difference between voltages $V_{DDP}$ and $V_{DDDA}$. Therefore, delay element 280 is adapted to generate a delay that is proportional to ($V_{DDP}-V_{DDDA}$). Furthermore, the delay generated by delay element 280 increases at fast process corners and with increasing temperature. In some embodiments, multiple stages of delay element 280 may be connected in series to generate the D0 delay. The output signal of delay element 280 at node $T_2$ is inverted by inverter 340 to generate signal Selftime_out.

In one embodiment, delay element D1 282 shown in FIG. 4 includes one or more inverters or buffer delays that receive supply voltage $V_{DDA}$. As the voltage supply $V_{DDA}$ increases, the delay across delay element D1 decreases. Conversely, as the supply voltage $V_{DDA}$ decreases, the delay across delay element D1 increases.

Figure 6:
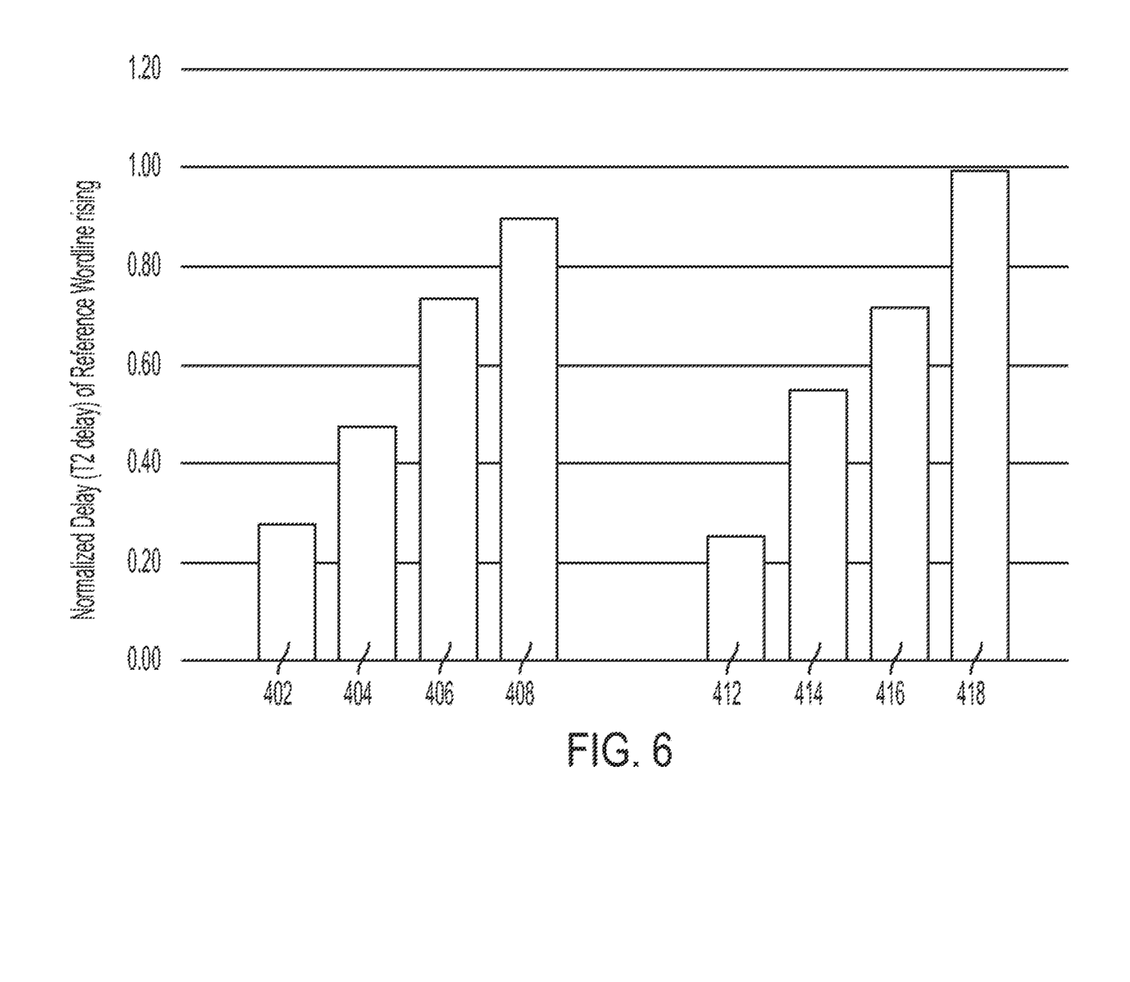
FIG. 6 shows computer simulation of the normalized self-timed delay of the SRAM of FIG. 1 under different voltages and process corners.

FIG. 6 shows computer simulation of the normalized self-timed delay of the reference wordline relative to the read clock or write clock (referred to in FIGS. 2 and 3 as time interval $t_2$) under various voltages and process corners and at $-40°$ temperature. Bars 402 and 412 show the normalized delay respectively at slow and fast process corners when $V_{DDA}$ and $V_{DDP}$ have the same value thus causing the delay element $D_1$ to be selected. Bars 404 and 414 show the normalized delay respectively at slow and fast process corners when ($V_{DDA}-V_{DDP}=-50$ my) thus causing the delay element Do to be selected. Bars 406 and 416 show the normalized delay respectively at slow and fast process corners when ($V_{DDA}-V_{DDP}=-100$ my) thus causing the delay element Do to be selected. Bars 408 and 418 show the normalized delay respectively at slow and fast process corners when ($V_{DDA}-V_{DDP}=-150$ my) thus causing the delay element Do to be selected. As is seen from the bar graph of FIG. 6, as the value of $V_{DDP}$ increases relative to $V_{DDA}$, the self-timed delay Do increases. Furthermore, for the same value of ($V_{DDA}-V_{DDP}$), it is seen that the delay Do increases at the fast process corner. An SRAM, in accordance with embodiments of the present invention, thus has an improved performance, dynamic power, and read and write margins that are closer one another compared to those of conventional SRAMs.

Figure 7:
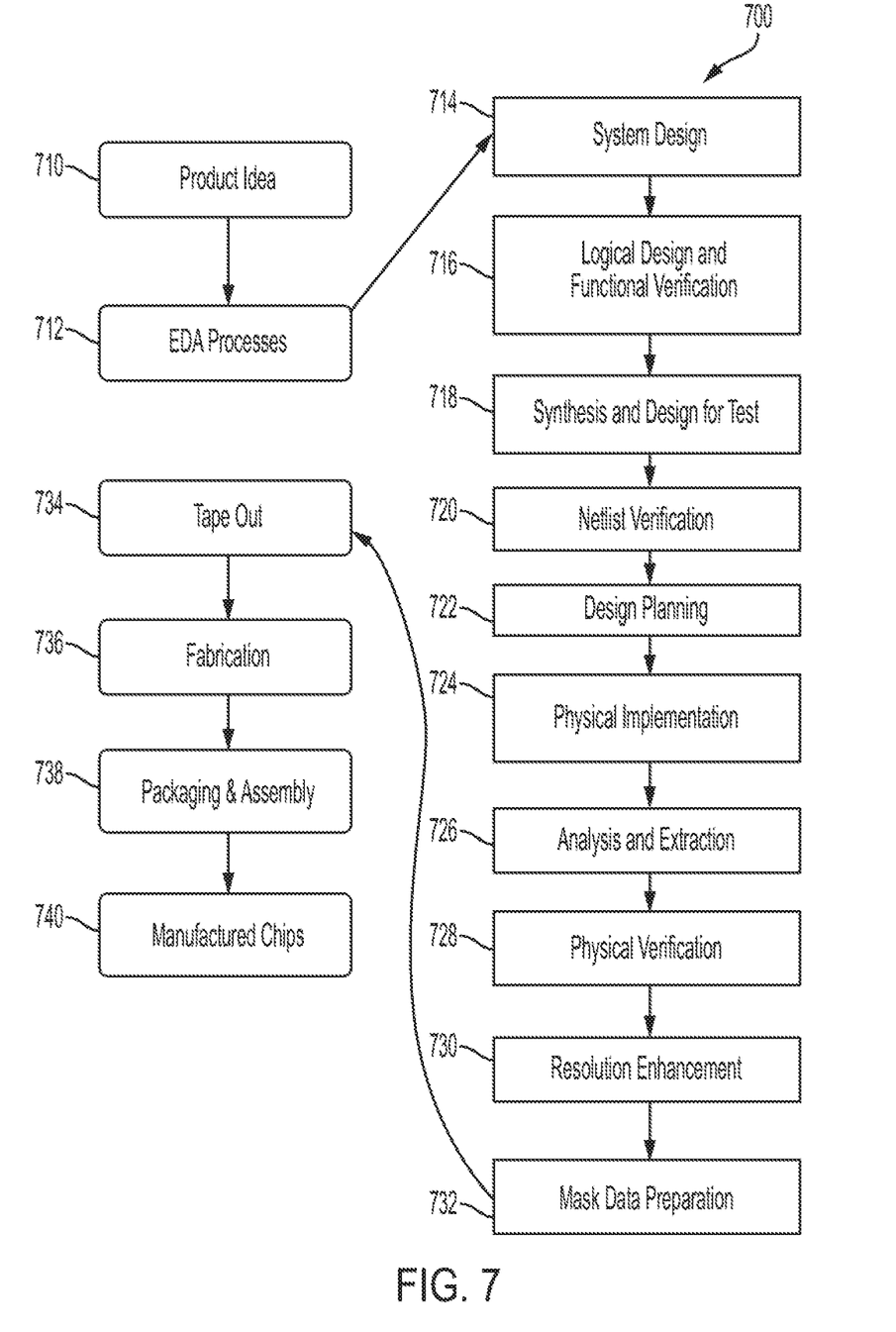
FIG. 7 is a flowchart of various processes used during the design and manufacture of an integrated circuit, in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 8) may be used to store the programs and data structures that are used by some or all of the EDA products described herein, and products used for development of cells for the library and for physical and logical design that use the library.

Figure 8:
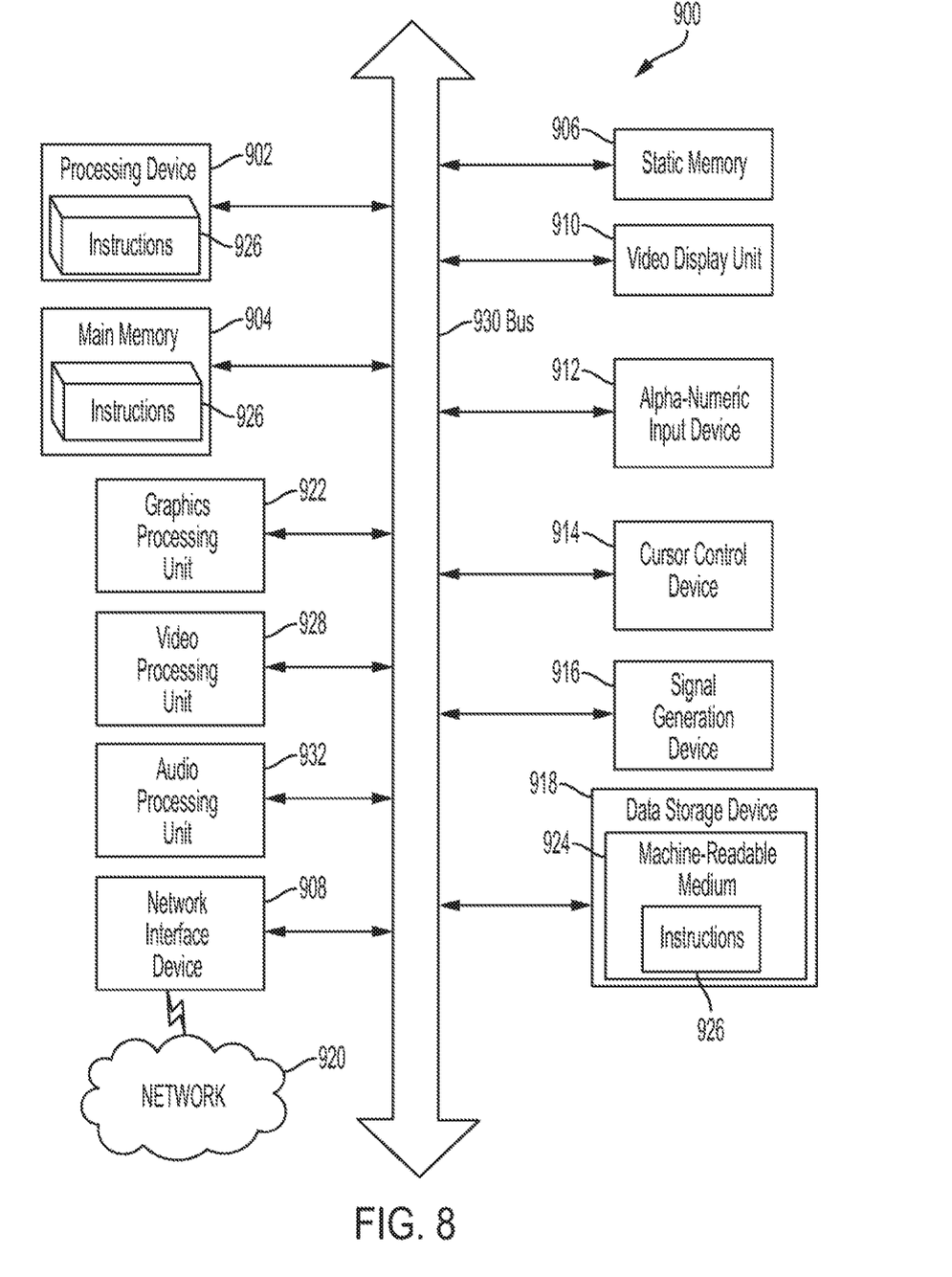
FIG. 8 is abstract diagram of an exemplary computer system in which embodiments of the present disclosure may operate.

FIG. 8 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A dual-rail memory comprising:
a memory array that operates using a first supply voltage;
a clock generation circuit that operates using a second supply voltage and generates a read clock signal in response to a read request;
a comparator that selects a delay between:
a first delay if the comparator determines that the first supply voltage is greater than the second supply voltage; and
a second delay if the comparator determines that the first supply voltage is smaller than the second supply voltage; and
a level shifter that generates a reference wordline read signal in response to the read clock signal, wherein the reference wordline read signal is delayed by the delay selected by the comparator.

2. The dual-rail memory of claim 1 wherein the level shifter is further adapted to supply a reference bitline read signal in response to the reference wordline read signal.

3. The dual-rail memory of claim 2 further comprising:
a clock reset circuit operating using the second supply voltage and adapted to reset the read clock signal in response to the reference bitline read signal.

4. The dual-rail memory of claim 3 wherein the clock generation circuit further generates a write clock signal in response to a write request, wherein the level shifter further generates a reference wordline write signal in response to the write clock signal, wherein the reference wordline write signal is delayed by the delay selected by the comparator.

5. The dual-rail memory of claim 4 wherein the level shifter is further adapted to supply a reference bitline write signal in response to the reference wordline write signal.

6. The dual-rail memory of claim 5 wherein the clock reset circuit is further adapted to reset the write clock signal in response to the reference bitline write signal.

7. The dual-rail memory of claim 3 wherein the reference wordline read signal is adapted to travel halfway through a wordline length before returning and being applied to a reference memory cell.

8. The dual-rail memory of claim 6 wherein the reference wordline write signal is adapted to travel halfway through a wordline length before returning and being applied to a reference memory cell.

9. The dual-rail memory of claim 3 wherein the comparator comprises:
first and second PMOS transistor having source terminals coupled to the second supply voltage;
a third PMOS transistor having a source terminal coupled to the second supply voltage, and a drain terminal coupled to a gate terminal of the first PMOS transistor and a drain terminal of the second PMOS transistor;
a fourth PMOS transistor having a source terminal coupled to the first supply voltage, and a drain terminal coupled to a gate terminal of the second PMOS transistor and a drain terminal of the first PMOS transistor;
a first NMOS transistor having a gate terminal coupled to a gate terminal of the first PMOS transistor and a drain terminal coupled to a drain terminal of the first PMOS transistor;
a second NMOS transistor having a gate terminal coupled to a gate terminal of the second PMOS transistor and a drain terminal coupled to a drain terminal of the second PMOS transistor;
a third NMOS transistor having a drain terminal coupled to the source terminal of the first and second NMOS transistors, a source terminal receiving the ground voltage, and a gate terminal responsive to the read clock signal, wherein a channel width to channel length ratio of the first NMOS transistor is greater than a channel width to channel length ratio of the second NMOS transistor.

10. The dual-rail memory of claim 9 wherein the comparator further comprises:
a pulse shaper adapted to generate a pulse in response to the read clock signal to turn on the third and fourth PMOS transistors.

11. The dual-rail memory of claim 10 wherein the comparator further comprises a state keeper circuit, the state keeper circuit comprising:
a fifth PMOS transistor having a source terminal receiving the second supply voltage, a drain terminal receiving an inverse of a first voltage present at a drain terminal of the first PMOS transistor, and a gate terminal receiving an enable signal generated in response to the read clock signal;
a fourth NMOS transistor having a source terminal receiving the ground voltage, a drain terminal receiving an inverse of a second voltage present at a gate terminal of the first PMOS transistor, and a gate terminal receiving an inverse of the enable signal.

12. The dual-rail memory of claim 11 further comprising:
a first controlled inverter adapted to enable a first delay element in response to a drain voltage of the fifth PMOS transistor; and
a second controlled inverter adapted to enable a second delay element in response to a drain voltage of the fourth NMOS transistor.

13. The dual-rail memory of claim 12 wherein the first delay element generates a delay that is defined by a difference between the first and second supply voltages.

14. The dual-rail memory of claim 13 wherein the first delay element generates a delay that is adapted to vary with temperature and variations of semiconductor processes used to fabricate the memory.

15. The dual-rail memory of claim 14 wherein the first delay element comprises:
a first inverter adapted to receive the second voltage supply;
a second inverter receiving the second voltage supply and having an input terminal coupled to an output terminal of the first inverter;
a sixth PMOS transistor having a gate terminal coupled to an input terminal of the second inverter, and a drain terminal coupled to an output terminal of the second inverter;
a seventh PMOS transistor having a source terminal receiving the first supply voltage, and a drain terminal coupled to a source terminal of the sixth PMOS transistor,
a fifth NMOS transistor having gate and drain terminals receiving the first supply voltage; and
a sixth NMOS transistor having a gate terminal coupled to a source terminal of the first NMOS transistor, a drain terminal coupled to an input terminal of the second inverter, and a source terminal receiving the ground voltage.

16. A method of controlling a dual-rail memory, the method comprising:
supplying a first supply voltage to a memory array disposed in the memory;
generating a read clock signal in response to a read request using a second supply voltage;

generating a reference wordline read signal in response to the read clock signal delaying the reference wordline read signal by a first delay if the first supply voltage is determined to be greater than the second supply voltage; and delaying the reference wordline read signal by a second delay if the first supply voltage is determined to be smaller than the second supply voltage.

17. The method of claim 16 further comprising:

supplying a reference bitline read signal in response to the reference wordline read signal.

18. The method of claim 17 further comprising:

resetting the read clock signal in response to the reference bitline read signal.

19. The method of claim 18 further comprising:

generating a write clock signal in response to a write request;

generating a reference wordline write signal in response to the write clock signal;

delaying the reference wordline write signal by the first delay if the first supply voltage is determined to be greater than the second supply voltage; and delaying the reference wordline write signal by the second delay if the first supply voltage is determined to be smaller than the second supply voltage.

20. The method of claim 19 further comprising:

supplying a reference bitline write signal in response to the reference wordline write signal.

21. The method of claim 20 further comprising:

resetting the write clock signal in response to the reference bitline write signal.

22. The method of claim 18 further comprising:

causing the reference wordline read signal to travel halfway through a wordline length;

causing the wordline read signal to return to an initial position; and applying the returned wordline read signal to a reference memory cell.

23. The method of claim 21 further comprising:

causing the reference wordline write signal to travel halfway through a wordline length;

causing the wordline write signal to return to an initial position; and applying the returned wordline write signal to a reference memory cell.

24. The method of claim 18 wherein the dual-rail memory comprises:

first and second PMOS transistor having source terminals coupled to the second supply voltage;

a third PMOS transistor having a source terminal coupled to the second supply voltage, and a drain terminal coupled to a gate terminal of the first PMOS transistor and a drain terminal of the second PMOS transistor;

a fourth PMOS transistor having a source terminal coupled to the first supply voltage, and a drain terminal coupled to a gate terminal of the second PMOS transistor and a drain terminal of the first PMOS transistor;

a first NMOS transistor having a gate terminal coupled to a gate terminal of the first PMOS transistor and a drain terminal coupled to a drain terminal of the first PMOS transistor;

a second NMOS transistor having a gate terminal coupled to a gate terminal of the second PMOS transistor and a drain terminal coupled to a drain terminal of the second PMOS transistor;

a third NMOS transistor having a drain terminal coupled to the source terminal of the first and second NMOS transistors, a source terminal receiving the ground voltage, and a gate terminal responsive to the read clock signal, wherein a channel width to channel length ratio of the first NMOS transistor is greater than a channel width to channel length ratio of the second NMOS transistor.

25. The method of claim 24 further comprising:

generating a pulse in response to the read clock signal to turn on the third and fourth PMOS transistors.

26. The method of claim 25 wherein the dual-rail memory further comprises:

a fifth PMOS transistor having a source terminal receiving the second supply voltage, a drain terminal receiving an inverse of a first voltage present at a drain terminal of the first PMOS transistor, and a gate terminal receiving an enable signal generated in response to the read clock signal;

a fourth NMOS transistor having a source terminal receiving the ground voltage, a drain terminal receiving an inverse of a second voltage present at a gate terminal of the first PMOS transistor, and a gate terminal receiving an inverse of the enable signal.

27. The method of claim 26 wherein the dual-rail memory further comprises:

a first controlled inverter adapted to enable a first delay element in response to a drain voltage of the fifth PMOS transistor; and a second controlled inverter adapted to enable a second delay element in response to a drain voltage of the fourth NMOS transistor.

28. The method of claim 27 wherein the first delay element generates a delay that is defined by a difference between the first and second supply voltages.

29. The method of claim 28 wherein said first delay element generates a delay that is adapted to vary with temperature and variations of semiconductor processes used to fabricate the memory.

30. The method of claim 28 wherein the first delay element comprises:

a first inverter adapted to receive the second voltage supply;

a second inverter receiving the second voltage supply and having an input terminal coupled to an output terminal of the first inverter;

a sixth PMOS transistor having a gate terminal coupled to an input terminal of the second inverter, and a drain terminal coupled to an output terminal of the second inverter;

a seventh PMOS transistor having a source terminal receiving the first supply voltage, and a drain terminal coupled to a source terminal of the sixth PMOS transistor, a fifth NMOS transistor having gate and drain terminals receiving the first supply voltage; and a sixth NMOS transistor having a gate terminal coupled to a source terminal of the first NMOS transistor, a drain terminal coupled to an input terminal of the second inverter, and a source terminal receiving the ground voltage.

* * * * *